United States Patent
Fjelstad

[11] Patent Number: 5,904,498
[45] Date of Patent: May 18, 1999

[54] CONNECTION COMPONENT WITH RELEASABLE LEADS

[75] Inventor: Joseph Fjelstad, Sunnyvale, Calif.

[73] Assignee: Tessera, Inc., San Jose, Calif.

[21] Appl. No.: 09/008,283

[22] Filed: Jan. 16, 1998

Related U.S. Application Data

[62] Division of application No. 08/547,170, Oct. 24, 1995.

[51] Int. Cl.⁶ .......................... H01L 21/44; H01L 21/48; H01L 21/50
[52] U.S. Cl. ............................................. 438/106
[58] Field of Search ................................. 438/106

[56] References Cited

U.S. PATENT DOCUMENTS

| | | |
|---|---|---|
| 3,825,353 | 7/1974 | Loro . |
| 4,451,505 | 5/1984 | Jans . |
| 4,651,191 | 3/1987 | Ooue et al. . |
| 4,893,172 | 1/1990 | Matsumoto et al. . |
| 5,065,223 | 11/1991 | Matsuki et al. . |
| 5,086,337 | 2/1992 | Noro et al. . |
| 5,196,268 | 3/1993 | Fritz . |
| 5,376,326 | 12/1994 | Medney et al. . |
| 5,518,964 | 5/1996 | DiStefano et al. . |
| 5,548,091 | 8/1996 | DiStefano et al. . |

*Primary Examiner*—John F. Niebling
*Assistant Examiner*—Joseph I. Jones
*Attorney, Agent, or Firm*—Lerner, David, Littenberg, Krumholz & Mentlik, LLP

[57] ABSTRACT

A connection component for a microelectronic device such as a semiconductor chip incorporates a dielectric layer and leads extending across a surface of the dielectric layer. Each lead has one end permanently fastened to the dielectric layer and another end releasably bonded to the dielectric layer. The releasable end is held in place by a bond having a relatively low peel strength, desirably less than about $0.35 \times 10^6$ dynes/cm.

10 Claims, 2 Drawing Sheets

CONNECTION COMPONENT WITH RELEASABLE LEADS

This is a Divisional of U.S. patent application Ser. No. 08/547,170 filed Oct. 24, 1995.

FIELD OF THE INVENTION

The present invention relates to a component useful in making electrical connections to microelectronic elements such as semiconductor chips, and to methods of manufacturing such components.

BACKGROUND OF THE INVENTION

Certain techniques for making semiconductor chip assemblies and similar microelectronic assemblies employ releasably attached leads. One such process is disclosed in commonly assigned, co-pending U.S. patent application Ser. No. 08/271,768, the disclosure of which is hereby incorporated by reference herein. In certain preferred embodiments described in the '768 application, a first element such as a dielectric layer in a connection component is provided with a plurality of elongated, flexible leads extending along a surface of the element. Each lead has a terminal end permanently attached to the first element and has a tip end offset from the terminal end. The tip ends of the leads may be releasably secured to the first element. A second element such as a semiconductor chip having contacts thereon is engaged with the first element or connection component, and the tip ends of the leads are bonded to contacts on the chip or second element. The elements are then moved away from one another so as to deform the leads and provide vertically extensive leads extending between the first and second elements, i.e., between the chip and the connection component. A compliant material may be introduced between the chip and the connection component.

The resulting structure allows the chip to move relative to the connection component without substantial stresses on the leads, and thus provides compensation for thermal expansion. The preferred structures can be readily tested and can be mounted on a further substrate such as a printed circuit panel or the like. Preferred embodiments of the processes disclosed in the '768 application can be used with chips or the microelectronic element having large numbers of terminals. In the preferred processes, many leads can be deformed simultaneously. In particularly preferred processes according to the '768 application, the leads on a given connection component or first element may be connected to contacts on a plurality of chips such as an array of several chips or numerous chips formed as part of a wafer, so that many leads are deformed simultaneously.

In certain embodiments disclosed in the '768 application, the tip end of each lead is bonded to the surface of the first element by a small spot of a base metal such as copper interposed between the tip end and the surface. Typically, such a spot is formed by a process in which the leads are formed from an etch-resistant metal such as gold overlying a continuous layer of the base metal. The leads have wide portions at the tip and terminal ends. The component is then subjected to an etching process so as to undercut the lead and remove the base metal from beneath the etch-resistant metal at all locations except at the terminal end and at the tip end. At the tip end, the most, but not all of the base metal is removed from beneath the etch-resistant metal, leaving a very small spot of the base metal. The strength of the bond between the tip and the connection component surface is effectively controlled by the size of the spot. Thus, although the base metal may provide a relatively high bond strength per unit area or per unit length, it may still provide a weak attachment, the tip end of the lead end of the first element surface. Although structures such as frangible lead sections and small buttons can provide useful releasable attachments for the tip ends of the leads, some care is required in fabrication to form these features. For example, formation of spots of uniform size beneath the terminal ends of leads on a large connection component requires careful control of the etching process.

As described in PCT International Publication WO 94/03036, the disclosure of which is hereby also incorporated herein by reference, a connection component may incorporate a support structure such as a polyamide or other dielectric layer with one or more gaps extending through such layer. Preferably, the support structure incorporates one or more flexible or compliant layers. The connection component may further include leads extending across the gap. Each lead has a first or terminal end permanently secured to the support structure on one side of the gap, and a second end releasably attached to the support structure on the opposite side of the gap. In preferred processes as taught by the '036 publication, the connection component is positioned on a semiconductor chip or other microelectronic element. Each lead is engaged by a bonding tool and forced downwardly into the gap, thereby detaching the releasably connected second end from the support structure. The leads are flexed downwardly into the gap and bonded to the contacts on the chip or the microelectronic element. Preferred connection components and processes according to the '036 publication also provide highly efficient bonding processes and very compact assemblies. The finished products provide numerous advantages such as compensation for thermal expansion, ease of testing and a compact configuration.

Other structures disclosed in the '036 publication and in the '768 application employ frangible lead sections connecting the releasable end of each lead to another structure permanently mounted to the support structure or first element. Frangible sections can also provide useful results. However, such frangible elements are most commonly formed by using the photo-etching or selective deposition processes used to form the lead itself to form a narrow section. The minimum width at the narrow section, can be no less than the smallest width formable in the process. As the other portions of the lead adjacent the narrow section must be wider than the narrow section, these other portions must be larger than the minimum attainable in the process. Stated another way, the leads made by such a process generally are wider than the minimum line width attainable in the formation process. This limits the number of leads which can be accommodated in a given area.

In other embodiments disclosed in the '036 publication, the first or permanently mounted terminal end of a lead may have a relatively large area, whereas the second or releasably mounted end of the lead overlying the support structure may have a relatively small area, so that such second end will break away from the support structure before the first end when the lead is forced downwardly by the bonding tool. This arrangement requires careful control of the dimensions of the ends to control the area of the bond between the lead end and the support structure and also requires a lead wider than the smallest element formable in the process.

Accordingly, further improvements in releasable lead structures and methods of making the same would be desirable.

SUMMARY OF THE INVENTION

One aspect of the present invention provides connection components for making semiconductor assemblies. A component according to this aspect of the present invention desirably includes a dielectric support structure having a surface. The support structure desirably is a dielectric layer having oppositely facing top and bottom surfaces. The support structure may be a layer of a polymer such as polyimide, polyamide or polyetherimide or combinations thereof, with or without additives. A plurality of leads extends along the surface of the dielectric layer, such as the bottom surface thereof. Each lead has a first region and a second region. The first and second regions preferably are disposed at or adjacent to opposite ends of the lead. The first region is permanently connected to the dielectric layer. The second region is releasably connected to the dielectric layer so that the second region can be detached from the dielectric layer by moving the lead downwardly relative to the dielectric layer. Desirably, the second region is attached to the dielectric layer through a release interface having a peel strength of less than about $0.35 \times 10^6$ dynes/cm, i.e., a peel strength of less than about two pounds per linear inch. More preferably, the peel strength of this interface is less than about $0.175 \times 10^6$ dynes/cm (one pound per linear inch).

According to a further aspect of the invention, a connection component may include a support structure such as a dielectric layer and a plurality of leads extending along the surface of such layer. Here again, each lead has a first region permanently connected to the dielectric layer and a second region releasably connected to the dielectric layer so that the second region can be detached from the dielectric layer. According to this aspect of the invention, the releasable connection desirably includes a release interface between a metallic surface of the lead directly abutting the polymeric material of the dielectric layer. The abutting metallic surface is formed from a release metal selected from the group consisting of copper, nickel, chromium, palladium, gold and alloys and combinations thereof. The polymeric material at the release interface desirably is substantially unoxidized. The interface may be formed by depositing the release metal onto the polymeric material of the dielectric layer as, for example, by electroless plating, chemical vapor deposition, sputtering, or other low-energy deposition processes to form a thin layer of the release metal and thus form the interface between the release metal and the polymeric layer. The lead may incorporate a structural metal, which may be the same as or different from the release metal, overlying the release metal. Release interfaces as aforesaid can be made by deposition processes which omit the steps normally used to assure good adhesion. Typically, in depositing metals such as copper onto dielectric polymers, the polymer is pretreated by oxidation, as by treatment with potassium permanganate or other oxidizing agents. Alternatively, high levels of adhesion are commonly obtained by sputtering nickel at high energies onto the polymeric layer.

According to a further aspect of the invention, the release interface may incorporate a layer of a first release metal securely bonded to the dielectric layer and a second release metal on the lead, the first and second release metals being weakly bonded to one another so that when the second region of the lead is pulled away from the dielectric layer, the second release metal separates from the first. The second release metal may be the same as, or different from, the structural material of the lead. For example, the first release metal may incorporate chromium whereas the second release metal may incorporate gold, copper, nickel, titanium, or combinations thereof.

According to a further aspect of the invention, a connection component may include a dielectric layer and leads substantially as aforesaid. The dielectric layer may have different surface conditions in different zones. Each lead may have a first region overlying the first zone and having relatively high adhesion to the dielectric layer, and a second region overlying the second zone, the second region having lower adhesion to the dielectric layer.

Components according to any of the foregoing aspects of the present invention may include fastening elements secured through the first or permanently mounted region of each lead and extending into the dielectric layer from the bottom surface thereof. Such fastening elements may be mechanically interlocked with the dielectric element so that the fastening element permanently secures the first region of each lead to the dielectric element. The fastening element may also be an electrical conductor, such as a via liner or riser extending partially or completely through the dielectric layer. Thus, the fastening element may extend upwardly through a hole in the dielectric layer to the top surface of the layer. Each fastening element may include a head extending outwardly from the hole over a portion of the top surface. The fastening element desirably is metallurgically bonded to the first region of the lead.

Alternatively or additionally, the first region of the lead may be secured to the dielectric element by a bond interface having a peel strength higher than the release interface. Thus, the bond interface may include an anchor metal permanently and securely bonded to the dielectric layer. The anchor metal may be the same as, or different from, the structural material of the leads. Thus, the anchor metal may include a metal selected from the group consisting of nickel, chromium, titanium, and combinations thereof applied by techniques which assure a strong bond between the anchor metal and the dielectric layer.

In the connection components according to the foregoing aspects of the invention, the releasable attachment of the second lead region is provided by the relatively weak interface between the second region and the dielectric layer. The release interface may extend over the entire surface area of the second region of the lead. This considerably simplifies the lead fabrication process. There is no need to undercut the lead so as to form a "button" with a very small surface area.

Further aspects of the present invention provide methods of making connection components having releasable leads. A method according to one such further aspect includes the step of providing a dielectric structure having a bottom surface and depositing a structural metal to form leads on such bottom surface so that each deposited lead includes a first region and a second region. The providing and depositing steps desirably are performed so as to provide a release interface having a peel strength of less than about $0.35 \times 10^6$ dynes/cm, and preferably less than about $0.75 \times 10^6$ dynes/cm between the structural metal in the second region and the bottom surface of the dielectric structure. Thus, the second region of each lead can be peeled away from the bottom surface of the dielectric structure. The method further includes the step of securing the first region of each lead to the dielectric structure so that the first region resists peeling away from the bottom surface. The securing step may include the step of providing fastening elements as discussed above, mechanically interlocked with the dielectric structure and bonded to each lead in the first region thereof. The dielectric structure may include a polymeric material on the bottom surface and a layer of a release metal weakly adhering to the polymeric material. The step of depositing the structural metal may include the step of depositing the structural metal onto the release metal. The method may further include the step of removing the release metal after deposition of the structural metal, while leaving the release metal in the area covered by the structural metal. As noted above, there is no need to undercut the leads in the second or release regions thereof.

A method according to a further aspect of the present invention includes the step of providing a dielectric structure having a bottom surface and selectively treating the bottom surface so as to provide first and second zones having different surface conditions, and then depositing a structural metal to form leads on the bottom surface so that each deposited lead includes first and second regions overlying the first and second zones, respectively. The providing, selective treating and depositing steps are performed so as to provide a release interface having a relatively low peel strength between the structural metal, the second region and the bottom surface of the dielectric structure and so as to provide a bond interface having a relatively high peel strength between the structural metal in the first region of each lead and the bottom surface of the dielectric structure. Thus, the second region of each lead can be peeled away from the bottom surface readily whereas the first region is securely anchored to the bottom surface.

Various selective treatments can be employed. Thus, a release metal can be provided only in the second zone of the bottom surface, the release metal adhering weakly to the polymeric material and forming the release interface. Alternatively, the release metal provided in the second zone may be selected so that a further metal, such as the structural metal of the leads themselves, will adhere poorly to the first-deposited release metal so that the further metal acts as a second release metal and forms a weak, release interface at the boundary between the first and second metals.

According to yet another alternative, the selective treating step may include the step of applying an adhesion-enhancing treatment to only the first zone of the bottom surface so that when the structural material of the leads is deposited, it will adhere strongly only in the first zone and adhere weakly in the second zone. For example, where the dielectric structure includes a polymeric material at the bottom surface, the adhesion-enhancing step may include the step of oxidizing such polymeric material. Such oxidation may be performed in only the first zone. Conversely, an adhesion-inhibiting step, such as application of a silicone or other release agent, may be performed selectively so as to affect only the second zone.

These and other objects, features and advantages of the present invention will be more readily apparent from the detailed description of the preferred embodiment, taken in conjunction with the accompanying drawings.

DETAILED DESCRIPTION OF THE PREFERRED EMBODIMENTS

Figure 1:
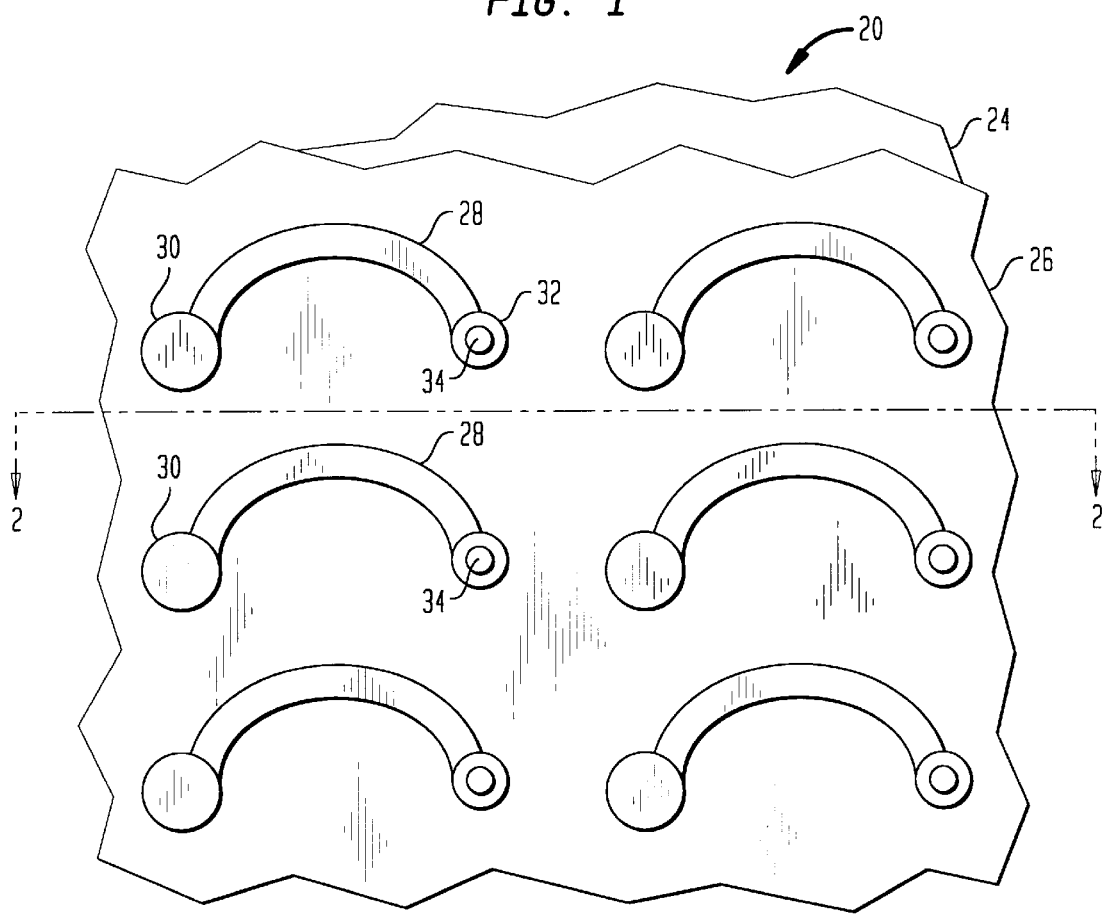
FIG. 1 is a fragmentary diagrammatic bottom plan view of a connection component in accordance with one embodiment of the invention at an intermediate stage in the manufacturing process.

A process in accordance with one embodiment of the present invention utilizes a dielectric structure 20 in the form of a layer of a dielectric polymer having a top surface 22 and a bottom surface 24. Polymer layer 20 may include a polymer of the type commonly used for tape automated bonding ("TAB") tapes in the semiconductor industry as, for example, polyamide, polyetherimide or polyimide. Preferably, layer 20 is thin and flexible. The thickness of the various elements is greatly exaggerated in the drawings for clarity of illustration. In practice, the layer may be on the order of 50 microns or less thick, and typically about 25 microns thick. A thin, continuous layer 26 of a first release metal is provided on the bottom surface 24 of layer 20. Release metal 26 may be selected from the group consisting of copper, nickel, gold and alloys thereof. The adhesion between layer 26 and bottom surface 24 is relatively poor. Thus, the peel strength of the interface between release metal layer 26 and layer 20 at the bottom surface 24 desirably is less than about $0.35 \times 10^6$ dynes/cm and more preferably less than about $0.175 \times 10^6$ dynes/cm, i.e., less than about 2 pounds per linear inch and desirably less than about 1 pound per linear inch. These values are substantially lower than the peel strengths of common metal to polymer interfaces designed to retain the metal permanently on the polymer. Components incorporating metals on polymers in the semiconductor industry commonly employ peel strengths of about 7–10 pounds per linear inch, i.e., about $1.225 \times 10^6$ to about $1.75 \times 10^6$ dynes/cm.

Relatively low peel strengths within the desirable ranges for use in the present invention can be achieved by depositing the release metal onto the bottom surface of the dielectric layer using a relatively low-energy deposition process, i.e., a process in which the metal is deposited onto the dielectric layer with relatively low kinetic energy. For example, ordinary electroless plating, sputter deposition at relatively low sputtering energies and chemical vapor deposition apply the deposited metal at low energies. Preferably, the bottom surface 24 of layer 20 is not subjected to any pretreatment to increase its affinity for the deposited metal. In processes intended to achieve high peel strength, polymeric layers can be oxidized, as by corona treatment, exposure to an oxygen-containing plasma, or, most commonly, by exposure to chemical oxidizers such as potassium permanganate ($KMnO_4$). These measures should not be employed where a relatively low peel strength releasable interface is desired. The peel strength of the bond can be reduced by pretreating surface 24 with a release agent such as a silicone oil (polydimethylsiloxane) or other agent which effectively reduces the surface energy at the interface. Thus, a weak interfacial bond can be achieved by omitting the steps commonly utilized in fabrication of metal/polymer laminates to achieve a strong bond. Metal layer 26 can also be provided as a separately formed foil, laminated to the bottom surface of layer 20. Release metal layer 26 should be as thin as practical consistent with formation of a coherent, continuous metal layer having sufficient electrical conductivity to allow electroplating of additional metals thereon. For example, layer 26 may be between about 0.25 and about 1 microns thick.

A laminate commercially available under the trademark MICROCLAD from the Fortin Company of Sylmar, Calif. incorporated a layer of copper deposited on a layer polyimide with a peel strength of about $0.175 \times 10^6$ dynes/cm (1 pound/inch). This and other commercially available laminates can be employed as the dielectric layer and layer of release metal.

A structural metal such as gold, gold alloys, copper, copper alloys and nickel-titanium alloys is deposited on the exposed surface of release metal layer 26 to form a plurality of elongated leads 28, each lead having a terminal end 30 and a tip end 32. Each of the leads is curved when formed. The structural metal of leads 28 may be deposited by any suitable deposition process as, for example, by additive electroplating using a photographically patterned mask having apertures corresponding to the desired leads, or by subtractive process including the steps of applying a continuous covering of the structural metal and then selectively etching the structural metal away to leave the leads in the desired pattern. Where such a subtractive process is to be used, the structural material may be provided as a continuous layer in the starting laminate. Thus, the structural material and release layer may be provided as a sublaminate and laminated to the polymeric dielectric layer.

After the leads have been formed, a small mass 34 of a bonding material may be applied to the tip end 32 of each lead, on the surface of the structural metal facing away from the release layer 26 and polymeric layer 20. The bonding material may be a diffusion bonding material or a eutectic bonding material such as a metal or metals selected from the group consisting of tin, germanium and silicon. Alternatively, the bonding material may be a solder, a brazing alloy or a metal-filled polymer such as a an epoxy or a thermoplastic. The bonding material may be applied by conventional selective deposition processes such as additive electroplating, subtractive etching of a continuous sheet or the like.

After the leads have been formed, layer 26 is etched away using the structural metal of leads 28 as an etching mask. The structural metal of leads 28 desirably resists the etchant employed in this process. For example, where release metal layer 26 is formed from copper and structural metal 28 is gold, a $CuCl_2$/HCL etchant solution may be employed; such a solution will etch copper at a greater rate than gold. Moreover, the structural metal in leads 28 desirably is substantially thicker than the release metal in layer 26. Therefore, layer 26 will be etched away while leads 28 remain. Other removal processes in which the release metal layer is masked by the structural metal, such as plasma etching or sputter removal may also be employed. The removal process leaves individual strips 36 of the release metal between leads 28 and the bottom surface 24 of layer 20. Each such strip 36 has substantially the same size and shape as the overlying lead 28. Thus, the strips 36 of the release metal typically have substantially the same surface area as the leads 28. Although the etching process may undercut the leads and remove base metal from a small portion of the area between each lead and surface 24, such undercutting desirably affects only a small portion of the lead area, adjacent the edges of the lead.

The component is further treated by forming holes through layer 20 in registration with the terminal ends 30 of the leads and forming generally rivet-shaped metallic via liners 38 within each hole. Each via liner extends entirely through the dielectric layer to release metal layer 36, and is metallurgically bonded to the release metal layer. Each via liner is mechanically interengaged with the polymeric material of layer 20. Desirably, each via liner has a rim 40 extending outwardly from the hole over the top surface 22 of the dielectric layer. The holes may be formed by ablating the polymeric material with a laser such as a KrF laser utilizing conventional equipment to direct the beam from the laser onto the appropriate locations on the top surface of layer 22. The radiant energy from the laser tends to ablate polymeric materials at a relatively high rate, but typically does not ablate metals such as copper or gold. Therefore, the laser ablation process will form holes extending through the polymeric material to the release metal. The via liners can be formed by conventional methods commonly used to form vias in semiconductor connection components. For example, copper can be deposited within each hole in layer 22, and on the top surface, by electroless plating, followed by electroplating to build up the desired thickness of copper. Following application of the copper, the copper on the top surface can be selectively removed, leaving the via liners and rims as shown. During these procedures, a temporary mask may be applied over the lower surface of the polymeric layer and over leads 28 and the associated components.

Figure 2:
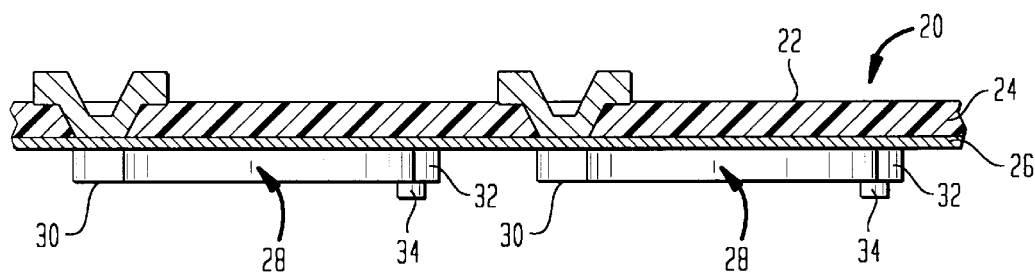
FIG. 2 is a fragmentary diagrammatic sectional view taken along lines 2—2 in FIG. 1.
Figure 3:
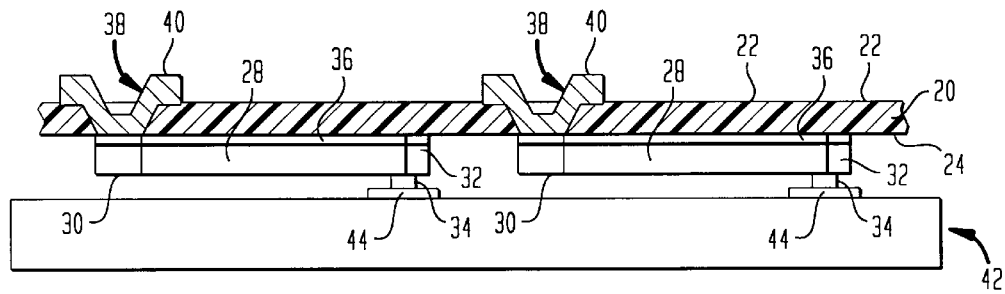
FIG. 3 is a view similar to FIG. 2 but showing the completed component in conjunction with a microelectronic element during an assembly process utilizing the component.

Each via liner is strongly secured to the release metal layer 36 and hence to the structural metal of lead 28 at the terminal end 30 of the lead. Because each rivet-shaped via liner 38 is mechanically interengaged with the dielectric layer by the engagement between the rim 40 and the top surface 22, a first region of each lead, at and adjacent the terminal 30 of the lead, is permanently and securely fastened to the dielectric layer. A second region of each lead, at the tip end 32 and adjacent thereto, is only weakly held to the dielectric layer. The interface between the release metal in each strip 36 retains the original low peel strength of the interface between layer 26 (FIG. 2) and the dielectric layer. There is, accordingly, a release interface between the structural metal of the lead and the dielectric layer in the second region of the lead, adjacent the tip end. As used in this disclosure, the term "release interface" refers to an interface between two layers having a peel strength substantially less than the cohesive strength of either layer. That is, a release interface is an interface which permits the layers to be peeled apart without destroying either layer.

The connection component can be utilized by engaging it with one or more microelectronic components 42 having contacts 44 on a surface. The connection component is aligned with the microelectronic element so that the tip end or second region 32 of each lead is aligned with the contacts on the microelectronic element. As described in the aforementioned U.S. patent application Ser. No. 08/271,768, the releasable engagement between the second region or tip ends 32 of the leads holds the tip ends in position on the dielectric layer during handling and alignment with the microelectronic element.

Figure 4:
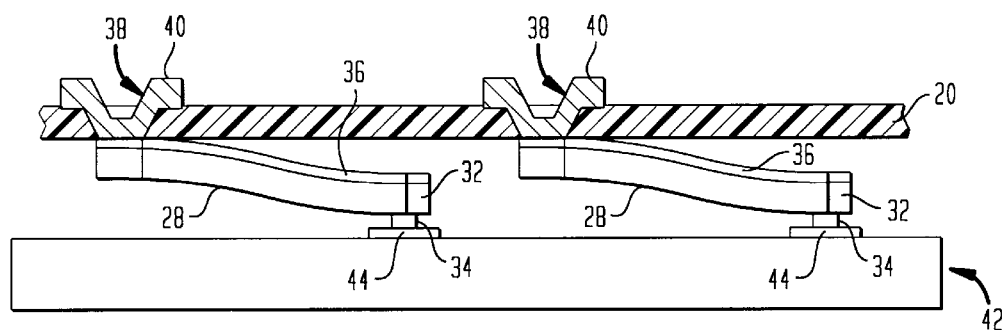
FIG. 4 is a view similar to FIG. 3 but depicting the connection component and microelectronic element at a later stage in the assembly process.

After alignment, the bonding material 34 carried on the lead tip ends is activated to bond the tip end or second region 32 of each lead to a contact 44, thereby connecting the leads, and hence the associated via liners 38, to the contacts. After bonding, the dielectric layer and microelectronic element 42 are moved away from one another, thus deforming each of the leads to a vertically extensive configuration as illustrated in FIG. 4. In this process, the release metal strips 36 peel away from the bottom surface 24 of the dielectric layer 20 in the second region of each lead, adjacent the tip end 32 thereof. However, the first or terminal region 30 of each lead remain securely anchored to the dielectric layer. As further disclosed in the Ser. No. 08/271,768 application, this controlled deformation brings the connector to a condition in which the via liners 38 and rims 40 are displaceable relative to the chip or microelectronic element 42 in horizontal directions parallel to the surface of the chip and in vertical direction towards and away from the chip surface. The via liners and rims may serve as terminals for attaching the connection component to a larger substrate such as a circuit board or multichip chip module substrate. A curable compliant material such as a gel or an elastomer may be injected between dielectric layer 20 and chip or microelectronic element 42. The particular arrangement of dielectric element 20 and the via liners 38 depicted in the drawings has been simplified for purposes of illustration. Thus, dielectric element 20 may incorporate one or more potential plane elements, such as a ground plane or power potential plane and may also incorporate one or more layers of conductors extending either along the surfaces of the dielectric element or within it. Via liners 38 need not extend entirely through the dielectric element, but instead, may extend to internal conductors so that each via liner is mechanically locked to the element by the associated internal conductor. Dielectric element 20 may be a multilayer structure. Also, although only a few leads are depicted in the drawing, a connection component in accordance with the invention may include any number of leads, to match the number of connections required by the microelectronic device. A typical semiconductor chip may require several hundred connections. Also, the dielectric layer may be large enough to overlie several chips or an entire wafer including numerous chips. As disclosed in the '758 application, multiple chips can be assembled to a single connection component and, after the aforementioned deformation and injection steps, the connection component can be severed so as to provide individual assemblies each incorporating one or few chips. Where an assembly includes more than one chip, the conductors in the dielectric element may interconnect the chips with one another.

A connection component according to a further embodiment of the invention includes a dielectric layer having a bottom surface 124. Bottom surface 124 is subjected to a differential treatment so as to form a first zone and a second zone with different surface conditions. Leads 128 are formed from a structural material overlying surface 124. Each lead has a first region 130 in the first zone 125 and a second region 132 in the second zone 127. A bonding material 134 is provided on the surface of second region 132 facing away from the dielectric layer. The surface conditions within first zone 125 and second zone 127 are selected so that those portions of the lead overlying second zone 127 have a weaker adhesion to the dielectric element than those portions overlying first zone 125.

According to one such differential treatment, second zone 127 may be provided with a layer of a release metal similar to layer 36 discussed above with reference to FIGS. 1–4, so that the release metal itself forms a release interface with the underlying polymeric material of the dielectric layer. This release metal may be omitted in first zone 125. The bottom surface may be selectively masked to occlude zone 125 prior to application of the release metal. Alternatively, the release metal may be provided as a continuous layer, such as layer 36 discussed above, and this continuous layer may be selectively removed in the first zone 125, as by etching, prior to deposition of the structural metal to form the leads. The first zone 125 may be treated with an oxidizing agent or other agent which will increase the adhesion of the lead structural metal to the polymeric layer.

Alternatively or additionally, a layer of an adhesion enhancing bond metal may be provided on only the first zone 125 so that the bond metal is firmly attached to the underlying polymer. The adhesion enhancing bond metal may be a metal such as copper, gold or other material compatible with the structural metal of the lead and adapted to form a firm bond thereto when the structural metal is applied onto the bond metal. The bond metal may be applied under conditions known to provide good adhesion such as by applying the bond metal after oxidation of the polymeric surface or by applying the bond metal in a high energy process such as ion beam implantation, high energy sputtering or the like. The bond metal is either selectively applied, with masking of the second region, or uniformly applied and then selectively removed from the second region as by etching. When the structural metal of the lead is applied, it bonds securely to the bond metal in the first region 125 and hence forms a secure, permanent bond to the underlying polymer in the first region 130 of the lead, disposed within the first zone 125. In the second region 132 of the lead, the structural metal in the second region 132 of the lead forms a relatively, weak releasable bond with the polymeric material. After application of the structural metal, the bond metal in region 125 is selectively removed by etching using the structural metal as an etching mask.

In yet another arrangement, the second region can be selectively treated to inhibit adhesion of the structural metal. Thus, a first release metal such as chromium or nickel can be provided only in the second region, either by selective deposition or by deposition of a uniform layer on surface 124 and selective removal from first region 125. The structural metal may then be applied under conditions which produce good adhesion with the polymeric surface in the first region 125, but which produce poor adhesion to the first release metal in region 127. Under these conditions, the structural metal of the lead serves as a further release metal in the second zone 127 and in the second region 132 of the lead. The structural metal of the lead in the second region 132 is only weakly bonded to the underlying first release metal, so that the lead can be effectively peeled away from the first release metal. In this regard, it should be noted that the strength of the bond interface between a structural metal and the first release metal depends on the conditions of deposition as well as the composition of the metals. For example, a chromium layer typically bonds only weakly with metals applied onto the chromium layer by electroplating, but will bond strongly with metals applied by high-energy sputtering.

Figure 5:
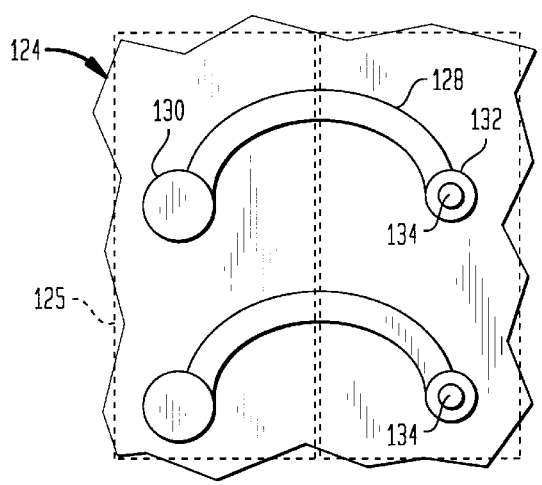
FIG. 5 is a fragmentary diagrammatic bottom plan view of a connection component in accordance with a further embodiment of the invention.

In all the embodiments discussed with reference to FIG. 5, the polymeric surface is selectively treated only in first zone 125 to enhance adhesion of the structural metal to the underlying polymer layer; or selectively treated only in second zone 127 to reduce such adhesion; or both, thereby providing efficient surface conditions in the first and second zones.

Figure 6:
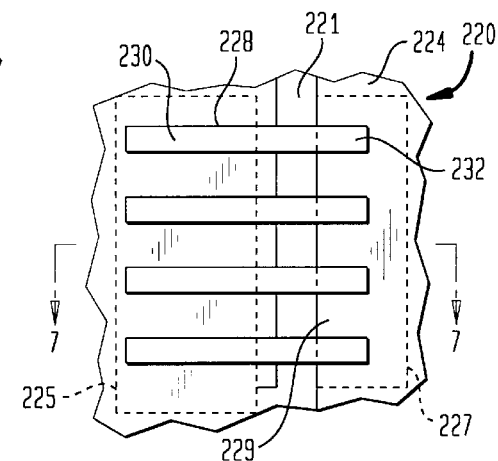
FIG. 6 is a fragmentary diagrammatic bottom plan view depicting a portion of a connection component in accordance with a further embodiment of the invention.
Figure 7:
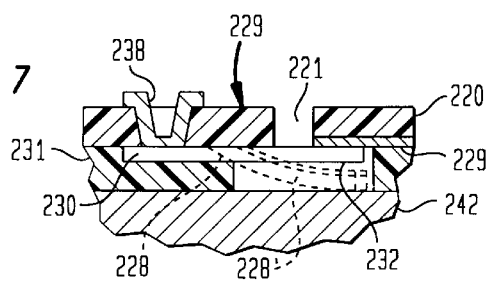
FIG. 7 is a fragmentary diagrammatic sectional view taken along line 7—7 in FIG. 6.

A connection component according to a further embodiment of the invention, partially illustrated in FIGS. 6 and 7, includes a dielectric layer 220 having an elongated gap 221 extending through the dielectric layer. Leads 228 extend across the gap. The general layout of the dielectric layer and leads may be as disclosed in the aforementioned International Patent Publication WO/94-03036. Each lead includes a first region 230 on one side of the gap securely connected to dielectric layer 220 and a second region 232 on the opposite side of the gap. In this configuration as well, the bottom surface 224 of the dielectric layer may have a first zone 225 treated to enhance adhesion between the lead and the bottom surface; a second zone 227 treated to inhibit adhesion or both. As illustrated, a layer of chromium 229 (FIG. 7) overlies the second region 227. The structural metal of lead 228 forms only a very weak bond with the layer of chromium so that the interface between structural metal 228 and chromium layer 229 serves as a release interface between the structural metal and the polymeric layer. In use, the polymeric layer is positioned over a microelectronic component 242, such as a semiconductor chip, and a compliant layer 231 is provided between the polymeric layer and the microelectronic element.

As disclosed in the aforementioned '036 publication, a bonding tool is advanced downwardly into gap 221, thereby engaging the lead and forcing the lead downwardly, to the position illustrated in broken lines at 228' in FIG. 7. As the bonding tool forces the lead downwardly, the second region 232 of the lead peels away from chromium layer 229 and hence is detached from the polymeric layer 220. The first region 230 remains securely bonded to the polymeric layer. As in the embodiments discussed above, a via liner 238 mechanically interengaged with the polymeric layer 220 may be metallurgically bonded to the lead in the first region thereof, both to act as a terminal for the lead and to fully secure the first region of the lead to the polymeric layer. Any of the treatments discussed with reference to FIG. 5 may be used in the configuration of FIGS. 6 and 7. Further, the second or weak-bonding zone 227 may extend across the gap, over a small strip 229 on the first side of the gap, so that a small portion of each lead on the first side of the gap is releasably bonded to the polymeric layer. This allows the lead to bend in a gradual manner at the gap and reduces any tendency to stress concentration at the bend. Where a via liner 238 or other mechanical fastener secures the first region of the lead, the releasable bond may extend throughout the first region of the lead as well as the second region.

The selective treatment employed in some embodiments to provide strong, permanent bonds in one zone of the surface and weak, releasable bonds on another zone requires additional processing steps. Therefore, where via liners or other suitable mechanical fastening elements can be used to secure the first region of each lead, it is normally more economical to provide the weak, releasable bond non-selectively, over the entire surface of the polymeric substrate and hence over the entire length of each lead. Also, a metallic release layer such as layer 229 (FIG. 7) which remains on the polymer surface should be configured so that after release of the leads from the surface, the metallic release layer is isolated from signal-conducting elements of the structure. In the arrangement of FIG. 7, metallic release layer 229 is electrically isolated from the leads and via liners when the leads are displaced to position 228'. It is normally undesirable to leave a metallic release layer in contact with any signal-carrying element of the system. For example, if a metallic release layer were to remain attached to the polymer substrate after deformation of the leads in the region surrounding via liner 238 (FIG. 7) or in the region surrounding via liner 38 (FIGS. 3 and 4), the release layer could cause shorting between adjacent via liners. Also, pieces of a remaining release in contact with signal-carrying elements can radiate and reflect signals. For these reasons, care should be taken to avoid leaving pieces of remaining metallic release layers on the polymer surface in contact with the signal-carrying elements. In a further embodiment, a metallic release layer which remains in place on a polymeric surface, isolated from the signal-carrying elements of the system, can be used as a ground or power plane.

Numerous further variations and combinations of the features discussed above can be utilized without departing from the present invention as defined by the claims. Accordingly, the foregoing description of the preferred embodiments should be taken by way of illustration rather than by way of limitation of the invention as defined by the claims.

What is claimed is:

1. A method of making connection component having a releasable lead comprising the steps of:

(a) providing a dielectric structure having a bottom surface;

(b) depositing a structural metal to form leads on said bottom surface so that each deposited lead includes first and second regions, said providing and depositing steps being performed so as to provide a release interface having a peel strength of less than about $0.35 \times 10^6$ dynes/cm between said structural metal in said second region and said bottom surface of the dielectric structure, whereby said second region of each said lead can be peeled away from said bottom surface of said dielectric structure; and (c) securing said first region of each said lead to said dielectric layer so that the first region resists peeling away from said bottom surface.

2. A method as claimed in claim 1 wherein said securing step includes the step of forming fastening elements mechanically interlocked with said dielectric structure and bonded to each said lead in the first region thereof.

3. A method as claimed in claim 1 wherein said dielectric structure includes a polymeric material on said bottom surface and a layer of a release metal weakly adhering to said polymeric material, said step of depositing said structural metal including the step of depositing said structural metal onto said release metal.

4. A method as claimed in claim 3 further comprising the step of removing said release metal after deposition of said structural metal so as to leave said release metal in the areas covered by said structural metal.

5. A method of making connection component having a releasable lead comprising the steps of:

(a) providing a dielectric structure having a bottom surface;

(b) selectively treating said bottom surface so as to provide first and second zones having different surface conditions; and (c) depositing a structural metal to form leads on said bottom surface so that each deposited lead includes first and second regions overlying said first and second zones, respectively, said providing, treating and depositing steps being performed so as to provide a release interface having a relatively low peel strength between said structural metal in said second region and said bottom surface of the dielectric structure and to provide to provide a bond interface having a relatively high peel strength between said structural metal in said first region and said bottom surface of the dielectric structure, whereby said second region of each said lead can be peeled away from said bottom surface of said dielectric structure and the first region is securely anchored to said bottom surface.

6. A method as claimed in claim 5 wherein said dielectric structure includes a polymeric material at said bottom surface, said selective treating step includes the step of providing a release metal directly abutting said polymeric material in only said second zone of said bottom surface so that said release metal adheres weakly to said polymeric material, whereby the release metal and the polymeric material form said release interface.

7. A method as claimed in claim 5 wherein said dielectric structure includes a polymeric material at said bottom surface, said selective treating step includes the step of providing a first release metal directly abutting said polymeric material in said second zone of said bottom surface, the method further comprising the step of depositing a second release metal onto said first release metal to thereby form said release interface between said first and second release metals.

8. A method as claimed in claim 7 wherein said structural material constitute said second release metal, said step of depositing a second release metal being performed during the step of depositing said structural metal.

9. A method as claimed in claim 5 wherein said selective treating step includes the step of applying an adhesion-enhancing treatment to only said first zone of said bottom surface.

10. A method as claimed in claim 9 wherein dielectric structure includes a polymeric material at said bottom surface and said adhesion-enhancing step includes the step of oxidizing said polymeric material in said first zone.

* * * * *

UNITED STATES PATENT AND TRADEMARK OFFICE
CERTIFICATE OF CORRECTION

PATENT NO. : 5,904,498
DATED : May 18, 1999
INVENTOR(S) : Fjelstad

It is certified that error appears in the above-indentified patent and that said Letters Patent is hereby corrected as shown below:

Column 2, line 42, delete ",".

Column 7, line 17, before "subtractive" insert --a--.

Column 7, line 33, delete "a" second occurrence.

Column 7, line 50, after "removal" insert --,--.

Column 8, line 64, "remain" should read --remains--.

Column 10, line 19, delete ",".

Column 12, line 5, after "making" insert --a--.

Column 12, line 36, after "making" insert --a--.

Column 12, line 51, delete "to provide".

Column 13, line 9, "constitute" should read --constitutes--.

Signed and Sealed this

Nineteenth Day of October, 1999

Attest:

Q. TODD DICKINSON

*Attesting Officer*    *Acting Commissioner of Patents and Trademarks*